United States Patent
Hsieh

(10) Patent No.: US 11,183,421 B2
(45) Date of Patent: Nov. 23, 2021

(54) INTERCONNECTION STRUCTURE OF METAL LINES, METHOD OF FABRICATING THE SAME AND SEMICONDUCTOR DEVICE

(71) Applicant: Changxin Memory Technologies, Inc., Anhui (CN)

(72) Inventor: Ming-Teng Hsieh, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 0 days.

(21) Appl. No.: 16/862,569

(22) Filed: Apr. 30, 2020

(65) Prior Publication Data

US 2020/0258772 A1    Aug. 13, 2020

Related U.S. Application Data

(63) Continuation of application No. PCT/CN2018/114530, filed on Nov. 8, 2018.

(30) Foreign Application Priority Data

Nov. 9, 2017 (CN) .......................... 201711099969.9

(51) Int. Cl.
*H01L 21/768* (2006.01)
*H01L 23/522* (2006.01)

(52) U.S. Cl.
CPC .... *H01L 21/7682* (2013.01); *H01L 21/76834* (2013.01); *H01L 23/5222* (2013.01)

(58) Field of Classification Search
CPC ........... H01L 21/7682; H01L 21/76834; H01L 23/5222; H01L 23/53295; H01L 21/76832; H01L 23/528; H01L 23/5386
See application file for complete search history.

(56) References Cited

U.S. PATENT DOCUMENTS

| | | | |
|---|---|---|---|
| 5,407,860 A | 4/1995 | Stoltz et al. | |
| 2002/0145201 A1 | 10/2002 | Armbrust et al. | |
| 2009/0309230 A1* | 12/2009 | Cui | H01L 21/76832 257/773 |
| 2012/0187460 A1* | 7/2012 | Lavoie | H01L 21/02211 257/288 |

FOREIGN PATENT DOCUMENTS

| | | |
|---|---|---|
| CN | 102751237 A | 10/2012 |
| CN | 107680953 A | 2/2018 |
| CN | 207409478 U | 5/2018 |

OTHER PUBLICATIONS

PCT International Search Report and the Written Opinion dated Jan. 31, 2019, issued in related International Application No. PCT/CN2018/114530 (9 pages).

* cited by examiner

*Primary Examiner* — Karen Kusumakar
(74) *Attorney, Agent, or Firm* — Sheppard Mullin Richter & Hampton LLP

(57) ABSTRACT

An interconnection structure for metal lines, a method of fabricating the same, and a semiconductor device are provided. A plurality of interconnection structure layers are stacked one above another on a substrate with the support of at least one supporting and covering layer. In each of the interconnection structure layers, spaces between a plurality of conductive components are filled with air which has a low dielectric constant, rather than with dielectric material. Thus, parasitic capacitances in the interconnection structure can be significantly reduced and RC delay can be mitigated.

15 Claims, 9 Drawing Sheets

INTERCONNECTION STRUCTURE OF METAL LINES, METHOD OF FABRICATING THE SAME AND SEMICONDUCTOR DEVICE

CROSS-REFERENCE TO RELATED APPLICATION

This application is a continuation application of International Patent Application No. PCT/CN2018/114530, filed on Nov. 8, 2018, which claims priority to China Patent Application No. 201711099969.9, filed with the China Patent Office on Nov. 9, 2017 and entitled "INTERCONNECTION STRUCTURE OF METAL LINES, METHOD OF FABRICATING THE SAME AND SEMICONDUCTOR DEVICE." The above-referenced applications are incorporated herein by reference in their entirety.

TECHNICAL FIELD

The present disclosure relates to the field of semiconductor technology and, in particular, to interconnection structures of metal lines, methods of fabricating the same, and semiconductor devices.

BACKGROUND

As the semiconductor industry enters the new era of high-performance and multi-functional integrated circuits (ICs), the density of semiconductor components in the ICs has increased, resulting in increasingly shortened distance among the components. When the semiconductor components are used to transmit electrical signals, a shortened distance among the components will increase the parasitic capacitance among them. In particular, with the continuous shrinking of the sizes of semiconductor devices, the parasitic capacitances between adjacent conductive components and the interference arising from such parasitic capacitances are becoming more and more problematic. For example, the parasitic capacitances can increase capacitive couplings among metal lines made of conductive materials in the semiconductor devices. As a result, power consumption and resistance-capacitance (RC) time constant are both increased.

To overcome these problems, low dielectric constant (low-k) materials have been used to fill the space between the conductive components. However, the dielectric constant of the filling materials often does not meet the requirement for interconnection structure of metal lines, thus limiting the performance of the semiconductor ICs. Therefore, to further improve the performance of the semiconductor ICs, it is desirable to further lower the dielectric constant of the filling materials between the conductive components, and to reduce the parasitic capacitances among metal lines of the semiconductor device.

SUMMARY OF THE DISCLOSURE

According to one aspect of the present disclosure, an interconnection structure of metal lines may comprise:
a substrate;
a plurality of interconnection structure layers stacked one above another on the substrate, each of the interconnection structure layers comprising a plurality of conductive components, wherein adjacent conductive components define an air gap therebetween, and each of the adjacent conductive components comprises a non-conductive side wall exposed to the air gap; and
at least one supporting and covering layer, each formed between adjacent interconnection structure layers, wherein each supporting and covering layer is attached to a top part of the conductive components of the underlying interconnection structure layer and covers the air gap defined by the adjacent conductive components of the underlying interconnection structure layer from above, and wherein each of the at least one supporting and covering layer supports the conductive components of the overlying interconnection structure layer.

In some embodiments, each of the conductive components may comprise a conductive structure layer and a covering film, wherein the covering film covers a top part and side walls of the conductive structure layer and also covers the air gap defined by the conductive components from below, and the portion of the covering film over the side walls of the conductive structure layer is exposed to the air gap.

In some embodiments, covering film may comprise a laterally extended protrusion at a peripheral area of a top part of the conductive structure layers to narrow an opening of the air gap covered by the overlying supporting and covering layer.

In some embodiments, each of the conductive components may further comprise a bonding layer located between the conductive structure layer and the covering film, wherein the bonding layer covers the top part and the side walls of the conductive structure layer and is covered by the covering film. In some embodiments, the bonding layer may comprise a silicon oxynitride layer.

In some embodiments, each of the conductive structure layers may comprise two metal diffusion barrier structure layers and a metal structure layer sandwiched between the two metal diffusion barrier structure layers.

In some embodiments, the air gap may have a cross-sectional width that is equal to or less than a cross-sectional width of either of the adjacent conductive components defining the air gap.

In some embodiments, in each of the interconnection structure layers, the maximum variation among heights of the conductive components' top surfaces is less than or equal to a thickness of the supporting and covering layer.

According to another aspect, a method for fabricating an interconnection structure for metal lines may comprise:
providing a substrate;
stacking a plurality of interconnection material layers and at least one supporting and covering layer one above another on the substrate, each of the at least one supporting and covering layer being disposed between adjacent interconnection material layers, wherein each of the interconnection material layers includes a plurality of conductive components and a sacrificial layer that fills gaps between the conductive components, and wherein the supporting and covering layer is attached to the conductive components and the sacrificial layer in the underlying interconnection material layer and supports the overlying interconnection material layer; and
removing the sacrificial layer to form an air gap between adjacent conductive components, wherein each of the adjacent conductive components comprises a non-conductive side wall exposed to the air gap, and wherein the conductive components of each of the interconnection material layers constitute an interconnection structure layer.

In some embodiments, among the stacked plurality of interconnection material layers, the lowermost interconnection material layer may be formed on the substrate, and the at least one supporting and covering layer and the remaining one or more interconnection material layers are stacked alternately on the lowermost interconnection material layer, wherein each of the substrate and the at least one supporting and covering layer is used as a supporting base for supporting a corresponding one of the interconnection material layers.

In some embodiments, the plurality of conductive components comprise a plurality of conductive structure layers and a covering film and stacking a plurality of interconnection material layers and at least one supporting and covering layer one above another on the substrate further comprises:

forming the plurality of conductive structure layers on one of the supporting bases; and forming the covering film over the supporting base, the covering film covering top parts and side walls of the plurality of conductive structure layers and also covering the sacrificial layer between adjacent conductive components from below.

In some embodiments, the covering film defines a laterally extended protrusion at a peripheral area of a top part of each conductive structure layer to narrow an opening of the air gap covered by the overlying supporting and covering layer.

In some embodiments, subsequent to the formation of the conductive structure layers and prior to the formation of the covering film, the method may further comprise:

forming a bonding layer over the supporting base, the bonding layer covering the top parts and the side walls of the conductive structure layers and constituting, together with the conductive structure layers and the covering film, the plurality of conductive components.

In some embodiments, forming a bonding layer on the supporting base may comprise:

forming a silicon oxide layer over the supporting base, the silicon oxide layer covering the top parts and the side walls of the conductive structure layers; and annealing the silicon oxide layer by using a nitrogen-containing gas to nitride the silicon oxide layer into a silicon oxynitride layer which constitutes the bonding layer.

In some embodiments, the sacrificial layer may have a top surface that is not higher than a top surface of each of the conductive components.

In some embodiments, the air gap may have a cross-sectional width that is equal to or less than a cross-sectional width of either of the adjacent conductive component defining the air gap.

In some embodiments, in each of the interconnection material layers, the maximum variation among heights of the conductive components' top surfaces may be less than or equal to a thickness of the supporting and covering layer.

According to yet another aspect, a semiconductor device comprises the interconnection structure for metal lines, wherein the interconnection structure of metal lines comprises: a substrate; a plurality of interconnection structure layers stacked one above another on the substrate, each of the interconnection structure layers comprising a plurality of conductive components, wherein adjacent conductive components define an air gap therebetween, and each of the adjacent conductive components comprises a non-conductive side wall exposed to the air gap; and at least one supporting and covering layer formed between adjacent interconnection structure layers, wherein each of the at least one supporting and covering layer is attached to a top part of the conductive components of the underlying interconnection structure layer and covers the air gap defined by the adjacent conductive components of the underlying interconnection structure layer from above, and wherein each of the at least one supporting and covering layer supports the conductive components of the overlying interconnection structure layer.

In the interconnection structure of metal lines of the present disclosure, through supporting and covering layers, a plurality of interconnection structure layers can be stacked one above another on a substrate. Further, adjacent conductive components of each interconnection structure layer define therebetween an air gap to which a non-conductive side wall of each conductive component is exposed. That is, the conductive components are insulated from each other by the air gap rather than by dielectric material. As the dielectric constant of air (e.g., 1.0) is lower than those of available dielectric materials (e.g., greater than 2.3), the interconnection structure of metal lines can have a lower effective k-value and hence a reduced parasitic capacitance compared to conventional interconnection structures. As a result, adverse consequences arising from parasitic capacitances, such as the RC delay problem of the interconnection structures, can be significantly mitigated.

Figure 1:
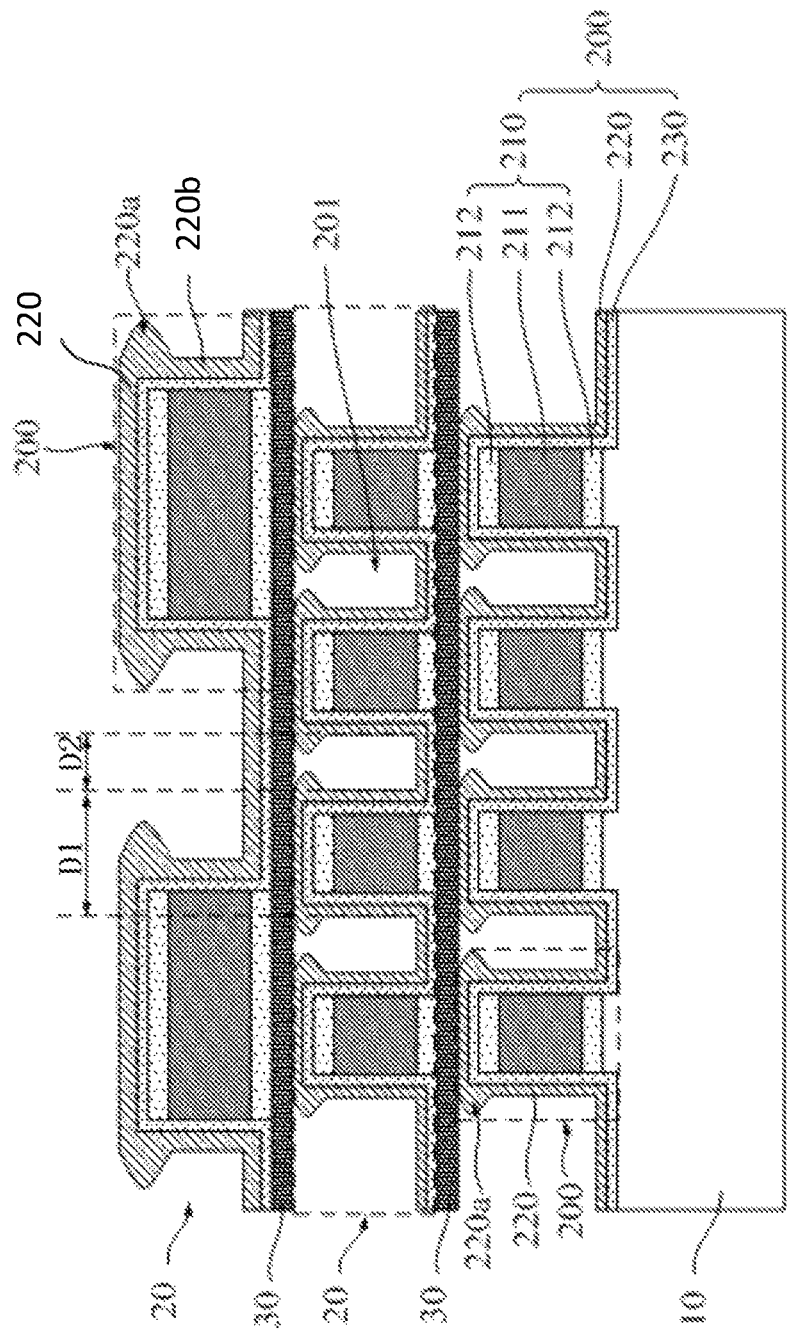
FIG. 1 is a structural schematic diagram of an interconnection structure of metal lines according to some embodiments of the present disclosure.

List of Reference Numerals is provided as follows.

| 10 | substrate |
|---|---|
| 20 | interconnection structure layer |
| 20a | interconnection material layer |
| 200 | conductive component |
| 210 | conductive structure layer |
| 210a | conductive material layer |
| 211 | metal structure layer |
| 211a | metal material layer |
| 212 | metal diffusion barrier structure layer |
| 212a | metal diffusion barrier material layer |
| 220 | covering film |
| 220a | lateral protrusion |
| 220b | non-conductive side wall |
| 230 | bonding layer |
| 201 | air gap |
| 201a | sacrificial layer |
| 30 | supporting and covering layer |

DETAILED DESCRIPTION

The present disclosure provides an interconnection structure of metal lines in devices, such as semiconductor devices. The interconnection structure of metal lines comprises:

a substrate;

a plurality of interconnection structure layers stacked one above another on the substrate, each of the interconnection structure layers comprising a plurality of conductive components, wherein adjacent conductive components define an air gap therebetween, and each of the adjacent conductive components comprises a non-conductive side wall exposed to the air gap; and at least one supporting and covering layer formed between adjacent interconnection structure layers, wherein each of the at least one supporting and covering layer is attached to a top part of the conductive components of the underlying interconnection structure layer and covers the air gap defined by the adjacent conductive components of the underlying interconnection structure layer from above, and wherein each of the at least one supporting and covering layer supports the conductive components of the overlying interconnection structure layer.

In the interconnection structure of the metal lines, with the support of the supporting and covering layer, the plurality of interconnection structure layers can be stacked one above another on the substrate. Moreover, as the gap between adjacent conductive components in the interconnection structure layers is not filled with any dielectric material, a parasitic capacitance between the conductive components is effectively reduced, significantly improving the performance of the interconnection structure. With the continuous shrinking of the sizes of semiconductor devices, reducing parasitic capacitances in the interconnection structure can effectively mitigate interference caused by such parasitic capacitances, e.g., significantly ameliorate RC delay in the interconnection structure.

The interconnection structure of metal lines, the method of fabricating the same and the semiconductor device, proposed in the present disclosure, will be described in greater detail below with reference to the accompanying drawings which illustrate several embodiments of the disclosure. Features and advantages of the disclosure will become more readily apparent from the following description. For convenience and clarity in explaining the embodiments, the drawings are provided in a simplified form not necessarily to scale.

Referring now to FIG. 1, a structural schematic diagram of an interconnection structure for metal lines is illustrated according to some embodiments of the present disclosure. As shown in FIG. 1, the interconnection structure of metal lines includes:

a substrate 10; and a plurality of interconnection structure layers 20 stacked sequentially on the substrate 10, each of the interconnection structure layers 20 comprising a plurality of conductive components 200, wherein adjacent conductive components 200 define an air gap 201 therebetween, and each of the adjacent conductive components 200 comprises a non-conductive side wall 220b exposed to the air gap 201.

As described above, each of the conductive components 200 in the interconnection structure layer 20 comprises a non-conductive side wall 220b exposed to the air gap 201. The non-conductive side wall 220b will be described in greater detail below with further reference to FIG. 1. By exposing side walls of conductive components 200 to the air gaps 201 defined by adjacent conductive components 200, the adjacent conductive components 200 are insulated from each other by air rather than by a dielectric material. The dielectric constant of air is typically 1.0, lower than those of other dielectric materials (typically greater than 2.3). Therefore, the interconnection structure has a lower effective k-value and thus effectively ameliorate RC delay problem.

While three interconnection structure layers 20 are illustrated in FIG. 1, in practice, the interconnection structure of metal lines may have only two, or more than three interconnection structure layers 20. The number of the interconnection structure layers 20 in one interconnection structure of metal lines is not limited herein. In addition, the arrangement or layout of the conductive components 200 in the interconnection structure layers 20 may be modified based on practical requirements. For example, the conductive components 200 in one interconnection structure layer 20 may not necessarily be aligned with the conductive components 200 in another interconnection structure layer 20. The arrangement shown in FIG. 1 is merely illustrative.

Also referring to FIG. 1, the interconnection structure further includes at least one supporting and covering layer 30 each positioned between adjacent interconnection structure layers 20 (only one supporting and covering layer 30 between adjacent interconnection structure layers 20 is shown in FIG. 1). Each supporting and covering layer 30 is attached to a top part of the conductive components 200 of the underlying interconnection structure layer 20 and covers, from above, the air gaps 201 defined by adjacent conductive components 200 of the underlying interconnection structure layer 20. That is, the supporting and covering layer 30 is not used to fill the space between the conductive components 200. Each supporting and covering layer 30 also supports the conductive components 200 of the overlying interconnection structure layer 20. The supporting and covering layer 30 may include a silicon mononitride (SiN) layer.

In the interconnection structure, with the support from the at least one supporting and covering layer 30, the interconnection structure layers 20 are able to be stacked one above another on the substrate 10. Each supporting and covering layer 30 supports the conductive components 200 of the overlying interconnection structure layer 20, while being supported by the conductive components 200 of the underlying interconnection structure layer 20. In this way, the interconnection structure layers 20 and the at least one supporting and covering layer 30 are alternately stacked on the substrate 10.

Additionally, the air gap 201 comprises a cross-sectional width "D2" that is equal to or less than a cross-sectional width "D1" of either of the adjacent conductive components 200 defining the air gap 201. The "cross-sectional widths" refer to widths of components in a plane perpendicular to the surface of the substrate 10. In this way, an overlying supporting and covering layer 30 provides stronger support from the underlying conductive components 200 so that it is less likely deformed and sinks into the air gaps 201.

In some embodiments, when the interconnection structure has only two interconnection structure layers 20, only one supporting and covering layer 30 may be required to be positioned between the two interconnection structure layers 20. In the embodiments shown in FIG. 1, as there are three interconnection structure layers 20, two supporting and covering layers 30 are included accordingly. For any interconnection structure layer 20 covered by a supporting and covering layer 30, the supporting and covering layer 30 further defines top boundaries of the air gaps 201. That is, the air gaps 201 have their side boundaries defined by the adjacent conductive components 200 in the interconnection structure layer 20 as well as their top boundaries defined by the supporting and covering layer 30.

Further, in some embodiments, since two adjacent conductive components 200 in each of the interconnection structure layers 20 are separated by the air gaps 201 between them, a supporting and covering layer 30 covers an underlying interconnection structure layer 20 by only contacting the top parts of the conductive components 200 in the underlying interconnection structure layer. A supporting and covering layer 30 supports an overlying interconnection structure layer 20 only at the conductive components 200 in the interconnection structure layer 20.

Furthermore, the maximum variation among the heights of the conductive components' 200 top surfaces is less than or equal to a thickness of the supporting and covering layer 30. In this way, when the supporting and covering layer 30 has an even or uniform thickness, while resting on the underlying interconnection structure layer 20, the supporting and covering layer 30 has a flat upper surface (i.e., the surface facing away from the underlying interconnection structure layer 20). Thus, the overlying interconnection structure layer 20 can be formed on the flat surface. In some embodiments, the conductive components 200 in each of the interconnection structure layers 20 are flush with one another at their top surfaces (e.g., the maximum height variation among their top surfaces does not exceed 10% of an average height of the conductive components 200), ensuring the supporting and covering layer 30 to have an adequately flat top surface.

In some embodiments, as shown in FIG. 1, each of the conductive components 200 may include a conductive structure layer 210 and a covering film 220 that covers the top part and the side walls of the conductive structure layer 210. Additionally, the portions of the covering film 220 over the side walls of the conductive structure layers 210 are exposed to the air gaps 201. Therefore, the portions of the covering film 220 covering the side walls of the conductive structure layers 210 constitute the non-conductive side walls 220b of the conductive components 200. In some embodiments, the non-conductive side walls 220b of the conductive components 200 may be formed in other ways known to those of skills in the art.

In the conductive components 200, the conductive structure layers 210 are configured to transmit electrical signals, and the covering films 220 can prevent signal crosstalk of the conductive structure layers 210 with other conductive devices by covering the conductive structure layers 210. Further, the covering films 220 can also protect the conductive structure layers 210 against damages impairing the integrity and performance of the conductive structure layers 210.

In some embodiments, at the peripheral area of the top part of the conductive structure layers 210, the covering film 220 forms a laterally extended protrusion 220a to narrow the opening of the air gaps 201 covered by the supporting and covering layer 30. As shown in FIG. 1, the lateral protrusions 220a extend laterally (e.g., parallel to the substrate's 10 top surface) towards the air gaps 201, thus narrowing the opening of the air gaps 201 between adjacent conductive components 200. Moreover, the lateral protrusions 220a can provide additional support for the overlying supporting and covering layers 30, so that an even stronger support can be achieved. Therefore, deformation of the supporting and covering layers 30 can be mitigated or even avoided, lowering the risk of the supporting and covering layers' 30 caving in the air gaps 201.

In some embodiments, the conductive components 200 may also include a bonding layer 230 located between the conductive structure layer 210 and the covering film 220. The bonding layer 230 covers the top part and side walls of the conductive structure layers 210 and is covered by the covering film 220. The bonding layer 230 can strengthen the attachment of the covering film 220 to the side walls of the conductive structure layer 210 so that the covering film 220 will not peel off therefrom. Moreover, the bonding layer 230 can provide additional protection of the conductive structure layers 210.

In some embodiments, the conductive structure layers 210 may be made of metallic materials. The covering film 220 may include, for example, a silicon nitride layer. The bonding layer 230 may include, for example, a silicon oxynitride layer. In some embodiments, each of the conductive structure layers 210 includes two metal diffusion barrier structure layers 212 and a metal structure layer 211 sandwiched between the two metal diffusion barrier structure layers 212. The material of the metal structure layer 211 may include, for example, tungsten (W), aluminum (Al) or the like. The material of the metal diffusion barrier structure layers 212 may include a metal nitride such as tungsten nitride (WN), aluminum nitride (AlN) or the like.

Figure 2:
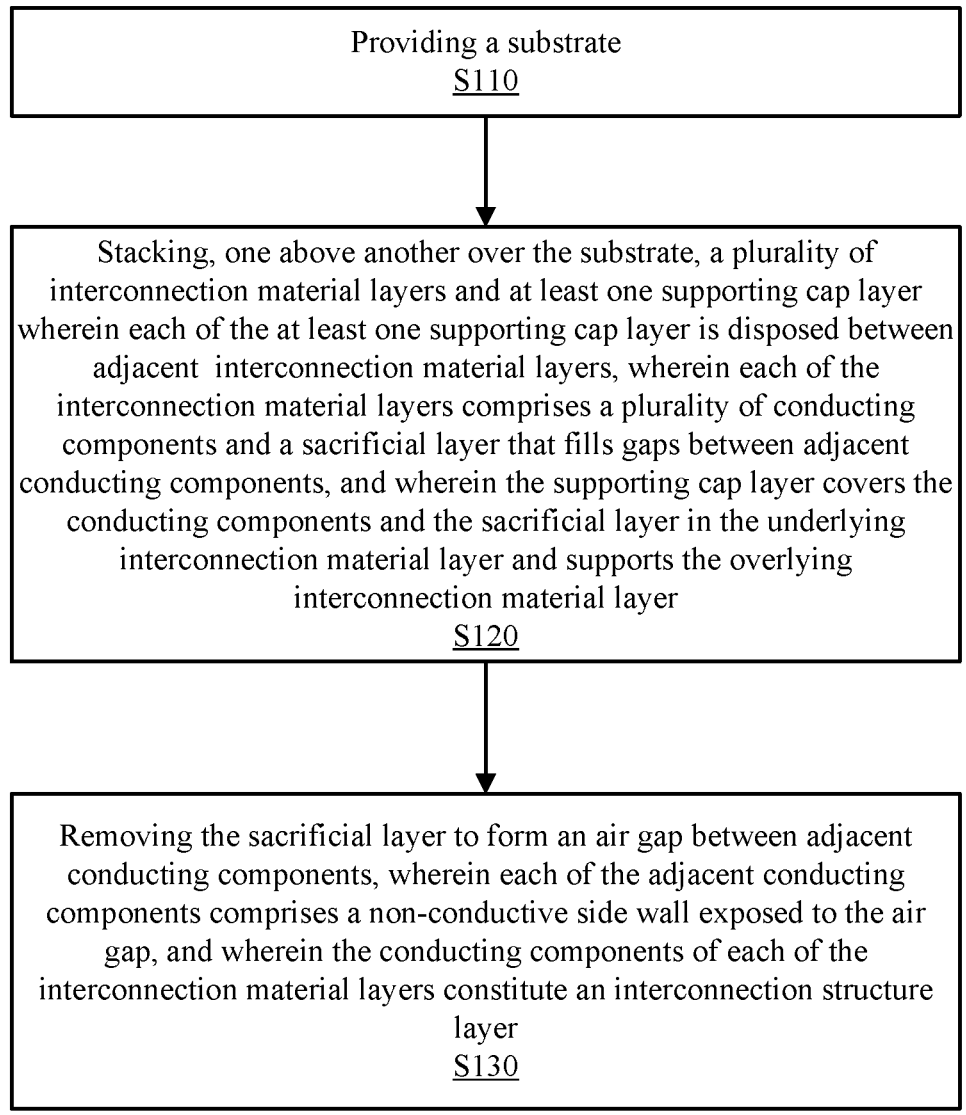
FIG. 2 is a flowchart of a method for forming an interconnection structure of metal lines according to some embodiments of the present disclosure.

The present disclosure also provides a method of fabricating an interconnection structure for metal lines. As described above with reference to FIG. 1, the interconnection structure contains air gaps which ameliorate parasitic capacitance problem of the interconnection structure. Referring now to FIG. 2, flowchart of a method for fabricating an interconnection structure for metal lines is illustrated according to some embodiments of the present disclosure. As shown in FIG. 2, the method includes the steps of:

S110: providing a substrate;

S120: stacking a plurality of interconnection material layers and at least one supporting and covering layer one above another on the substrate, each of the at least one supporting and covering layer disposed between adjacent interconnection material layers, wherein each of the interconnection material layers includes a plurality of conductive components and a sacrificial layer that fills the gaps between the adjacent conductive components, and wherein the supporting and covering layer is attached to the conductive components and the sacrificial layer in the underlying interconnection material layer and supports the overlying interconnection material layer; and S130: removing the sacrificial layer to form air gaps between adjacent conductive components, wherein each of the adjacent conductive components comprises a non-conductive side wall exposed to the air gap, and wherein the conductive components of each of the interconnection material layers constitute an interconnection structure layer.

During the fabrication of the interconnection structure, by filling the gaps between the adjacent conductive components with the sacrificial layer, the material of the supporting and covering layer subsequently formed on the conductive components does not present in the gaps. In this way, after the sacrificial layer is removed, air gaps will be formed between the adjacent conductive components. Additionally, during the fabrication the sacrificial layer can provide additional support to the overlying interconnection material layer.

The method of FIG. 2 will be described in greater detail below with reference to FIGS. 3A to 3G. Referring now to FIGS. 3A to 3G, schematic diagrams of structures created during the method of FIG. 2 are illustrated according to some embodiments of the present disclosure.

Figure 3A:
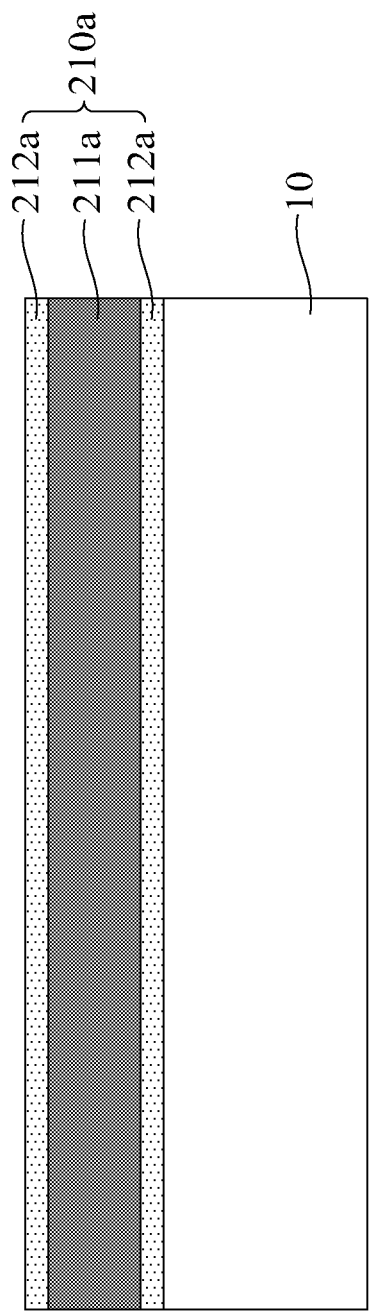
FIGS. 3A, 3B, 3C, 3D, 3E, 3F, and 3G are schematic diagrams of structures created during the method of FIG. 2 according to some embodiments of the present disclosure.

In step S110, as shown in FIG. 3A, a substrate 10 is provided. On the substrate 10 may be provided semiconductor components that can be electrically coupled to the subsequently-formed interconnection structures.

In step S120, as shown in FIGS. 3A to 3F, a plurality of interconnection material layers 20a and at least one supporting and covering layer 30 are stacked one above another on the substrate 10 such that each of the at least one supporting and covering layer 30 is disposed between adjacent interconnection material layers 20a. Each of the interconnection material layers 20a includes a plurality of conductive components 200 and a sacrificial layer 201a which fills the gaps between adjacent conductive components 200. The supporting and covering layer 30 is attached to the conductive components 200 and the sacrificial layer 201a of the underlying interconnection material layer 20a and supports the overlying interconnection material layer 20a.

The interconnection material layers 20a are used to form the interconnection structure layers 20 of the interconnection structure. Thus, a number of interconnection material layers 20a may be used to form the same number of interconnection structure layers 20 stacked one above another. In some embodiments, among the stacked multiple interconnection material layers 20a, the lowermost interconnection material layer 20a is formed on the substrate 10, and at least one supporting and covering layer 30 and the remaining interconnection material layer(s) 20a are stacked alternately on the lowermost interconnection material layer 20a. The substrate 10 and the at least one supporting and covering layer 30 each serves as a base for supporting a corresponding interconnection material layers 20a. In some embodiments, the conductive components 200 and the sacrificial layer 201a in the interconnection material layers 20a are all formed on the supporting bases, with the sacrificial layer 201a filling the gaps between adjacent conductive components 200.

In some embodiments, all of the interconnection material layers 20a may be formed through the same process. For example, the same process may be used to form the lowermost interconnection material layer on the substrate 10 as well as each of the remaining interconnection material layer(s) 20a on the corresponding at least one supporting and covering layer 30. The formation of the lowermost interconnection material layer 20a may include the following steps.

As shown in FIGS. 3A to 3E, in the first step of forming an interconnection material layer 20a, a plurality of conductive components 200 are formed on a base. When forming the lowermost interconnection material layer 20a, the base is the substrate 10. For the other above interconnection material layer 20a, the base may be the at least one supporting and covering layer 30.

In some embodiments, the conductive components 200 comprise a plurality of conductive structure layers 210 and a covering film 220 that covers the top part and side walls of each of the conductive structure layers 210. The covering film 220 is also formed below the bottom part of the sacrificial layer 201a between adjacent conductive components 200. In some embodiments, each of the conductive structure layers 210 comprises two metal diffusion barrier structure layers 212 and a metal structure layer 211 sandwiched between the two metal diffusion barrier material layers 212a.

In some embodiments, the formation of the conductive components 200 may be accomplished by the following steps.

First, as shown in FIG. 3A, a conductive material layer 210a is formed on the substrate 10. For example, the conductive material layer 210a may be formed using a deposition process.

In some embodiments, the conductive material layer 210a comprises two metal diffusion barrier material layers 212a and a metal material layer 211a sandwiched between the two metal diffusion barrier material layers 212a. For example, a bottom metal diffusion barrier material layer 212a is formed on the substrate 10, the metal material layer 211a is formed on the bottom metal diffusion barrier material layer 212a, and a top metal diffusion barrier material layer 212a is formed on the metal material layer 211a. The metal material layer 211a may be made of, for example, tungsten (W), aluminum (Al) or the like. The metal diffusion barrier material layers 212a may be made of metal nitride, for example, tungsten nitride (WN), aluminum nitride (AlN) or the like.

Figure 3B:
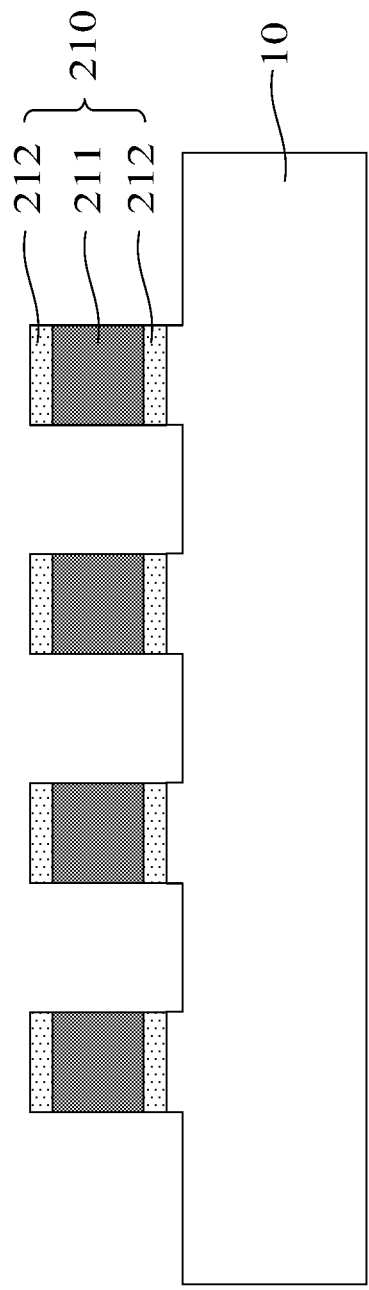

Next, as shown in FIG. 3B, the conductive material layer 210a is patterned to form a plurality of conductive structure layers 210 on the substrate 10 through patterning processes. The shapes or patterns of the conductive structure layers 210 may be determined based on practical requirements and is not limited herein.

In some embodiments, a photolithography process may be performed to define the pattern of the conductive structure layers 210. One or more etching processes may be carried out to sequentially etch through the top metal diffusion barrier material layer 212a, the metal structure layer 211a and the bottom metal diffusion barrier material layer 212a to form the metal structure layer 211, the top metal diffusion barrier structure layer 212 and the bottom metal diffusion barrier structure layer 212. Thus, the metal structure layer 211, the top metal diffusion barrier structure layer 212 and the bottom metal diffusion barrier structure layer 212 constitute the conductive structure layers 210.

Figure 3C:
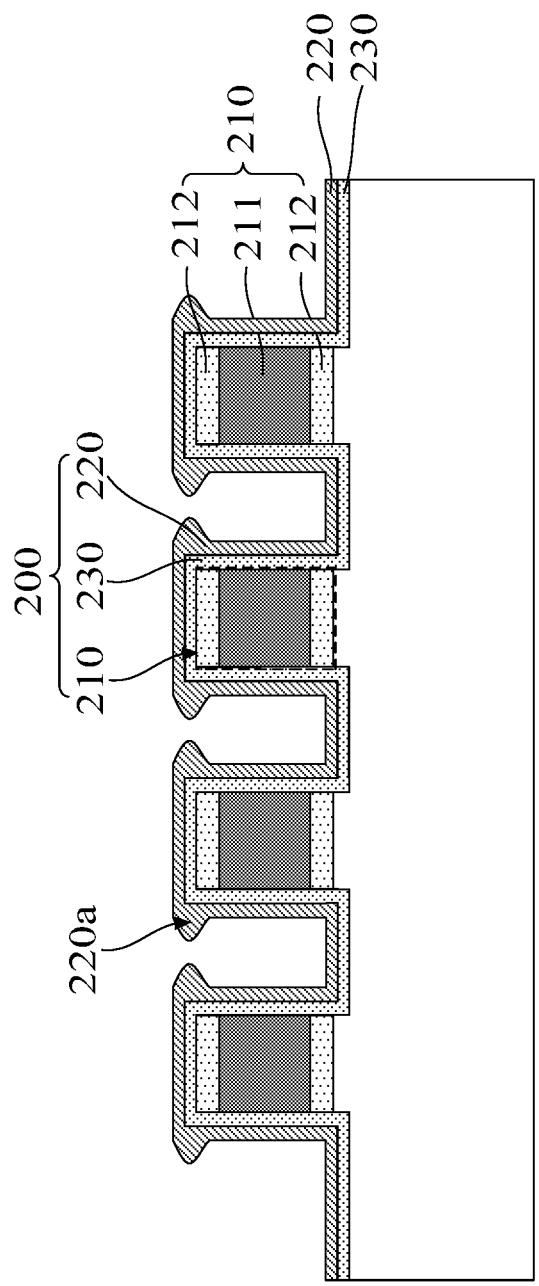

As shown in FIG. 3C, a bonding layer 230 may be formed over the substrate 10 prior to the formation of the covering film 220. The bonding layer 230 covers the top part and side walls of each of the conductive structure layers 210. In some embodiments, the bonding layer 230 further extends to cover the surface of the substrate 10. The bonding layer 230 covering the top part and side walls of each of the conductive structure layers 210 can strengthen the attachment of the subsequently-formed covering film 220 to the conductive structure layers 210 so as to prevent the covering film 220 from peeling off the conductive structure layers 210. For example, the covering film 220 is well bonded to the bonding layer 230 which in turn is well bonded to the conductive structure layers 210.

In some embodiments, the bonding layer 230 may be made of a silicon oxynitride layer (SiON), which can not only ensure a good attachment between the covering film 220 and the bonding layer 230, but also resist etchants used in the subsequent etching processes and maintain a good integrity.

In some embodiments, the silicon oxynitride layer may be formed through the following steps: forming a silicon oxide layer which covers the top part and side walls of each of the conductive structure layers 210 and the whole top surface of the substrate 10 except for the areas occupied by the conductive structure layers 210; and annealing the silicon oxide layer by using a nitrogen-containing gas to nitride the silicon oxide layer into the silicon oxynitride layer. The nitrogen-containing gas may be, for example, nitrous oxide (N2O).

Subsequently, as shown in FIG. 3C, the covering film 220 is formed on the surface of the bonding layer 230 so as to cover the bonding layer 230. Accordingly, the covering film 220 covers the top part and side walls of each of the conductive structure layers 210. The covering film 220 may include, for example, a silicon nitride (SiN) layer.

In some embodiments, the covering film 220 defines a laterally extended protrusion 220a at the peripheral area of the top of each conductive structure layer 210 to narrow the opening of the air gap 201 covered by the supporting and covering layer 30. In some embodiments, the formation of the covering film 220 may be accomplished by using a plasma-enhanced chemical vapor deposition (PECVD) process. The lateral protrusions 220a of the covering film 220 may be formed by controlling parameters of the PECVD process.

Accordingly, the conductive components 200 is formed, which includes the conductive structure layers 210, the bonding layer 230 and the covering film 220.

Figure 3D:
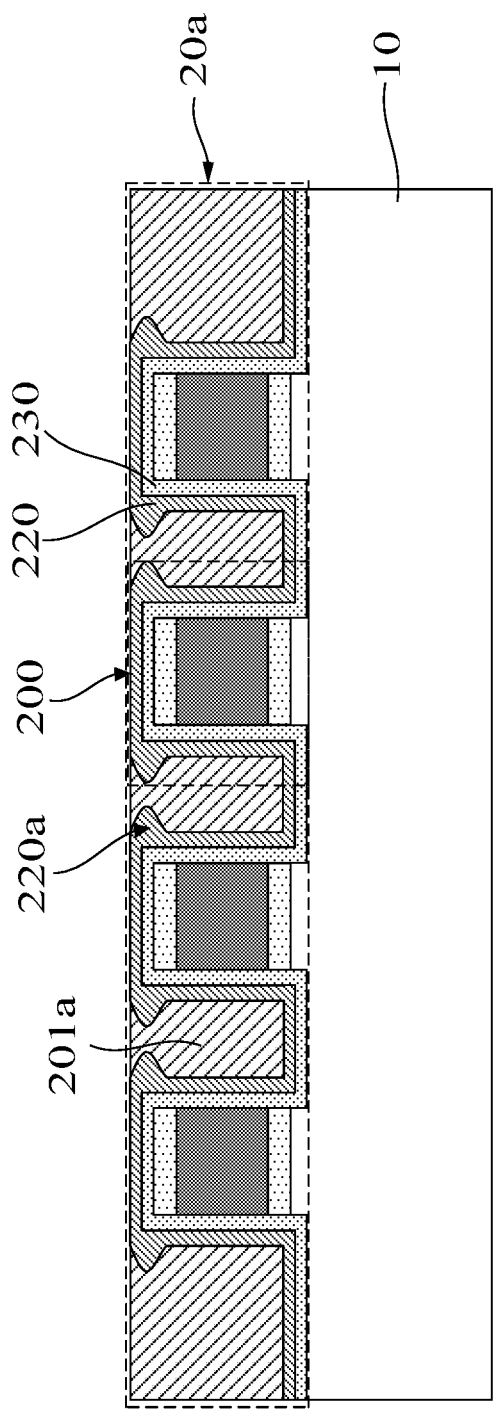

As shown in FIG. 3D, in a second step of forming the interconnection material layer 20a, a sacrificial layer 201a is formed on the base (e.g., the substrate 10 with respect to the lowermost interconnection material layer, and the at least one supporting and covering layer 30 with respect to the other above interconnection material layer 20a). The sacrificial layer 201a fills the gaps between the conductive components 200. In some embodiments, as the bonding layer 230 and the covering film 220 also cover the whole surface of the substrate 10 other than the areas occupied by the conductive structure layers 210, the sacrificial layer 201 rests on the covering film 220 between adjacent conductive components 200.

Additionally, a portion of the sacrificial layer 201a situated between the two adjacent conductive components 200 has a cross-sectional width that is equal to or less than a cross-sectional width of either of the adjacent conductive components 200. In this way, an air gap resulting from the subsequent removal of the sacrificial layer 201a also has a cross-sectional width that is equal to or less than the cross-sectional width of either of the conductive components 200. Thus, excessively large air gaps can be avoided and unfavorable deformation of the overlying supporting and covering layer 30 can be reduced.

Filling the gaps between adjacent conductive components 200 with the sacrificial layer 201 can prevent the subsequently-formed supporting and covering layer 30 from filling the gaps. Moreover, the sacrificial layer 201 can provide additional support to the overlying interconnection material layer 20a during the fabrication of the interconnection structure of metal lines.

Further, the sacrificial layer 201a does not cover the top part of the conductive components 200. In some embodiments, the top surface of the sacrificial layer 201 is not higher than the top surfaces of the conductive components 200. For example, the top surface of the sacrificial layer 201a may be flush with the top surfaces of the conductive components 200.

Figure 3E:
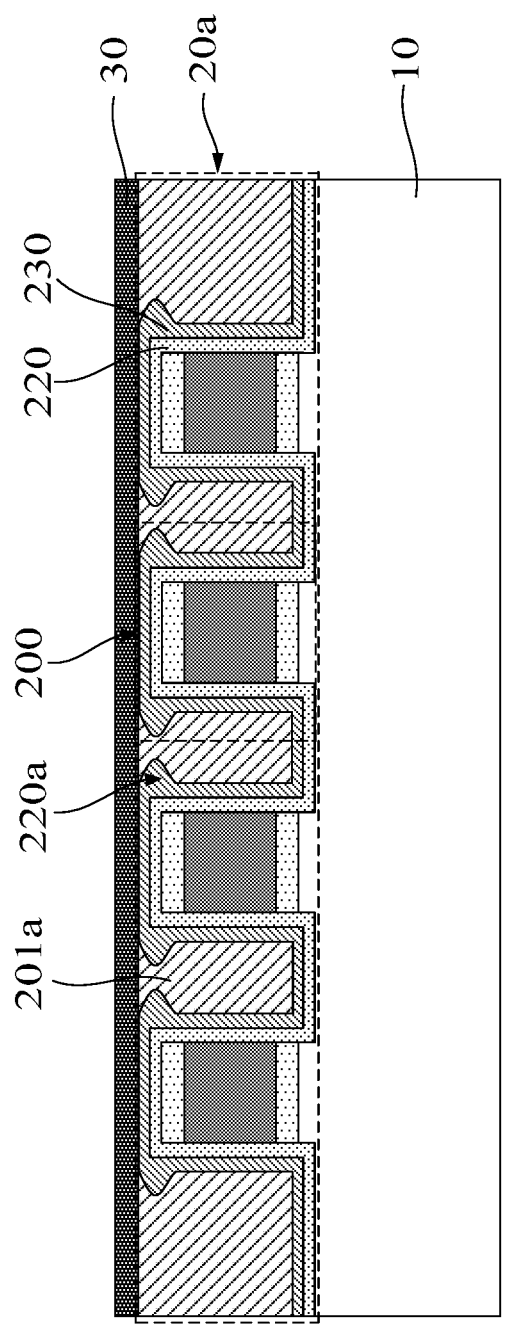

Furthermore, the maximum variation among the heights of the conductive components' 200 top surfaces in each interconnection material layer 20a is less than or equal to a thickness of the supporting and covering layer 30. That is, the top surfaces of the conductive components 200 in each interconnection material layer 20a are at the same or nearly the same horizontal level (e.g., the maximum variation across their heights does not exceed 10% of the average height of the conductive components 200). The top surface of the sacrificial layer 201a may be made flush with the top surfaces of the conductive components 200 by using a planarization process. As a result, an overlying layer can be subsequently formed on a flat surface. For example, as shown in FIG. 3E, the supporting and covering layer 30 is formed on a flat surface provided by the sacrificial layer 201a and the conductive components 200.

In some embodiments, the sacrificial layer 201a may be formed through the following steps including: first, forming a sacrificial material layer on the substrate 10, which fills the gaps between adjacent conductive components 200; and covers the top parts of the conductive components 200; and planarizing the sacrificial material layer using a planarization process. The planarization process may be, for example, a chemical mechanical polishing (CMP) process or an etch-back process. When the CMP process is used, the top parts of the conductive components 200 may serve as a polishing stop layer, causing the CMP process to stop at the top parts of the conductive components 200. When the etch-back process is used, the top parts of the conductive components 200 may provide an etch stop layer, causing etching of the etch-back process to stop at the top parts of the conductive components 200.

Accordingly, the interconnection material layer 20a is formed, which includes the sacrificial layer 201a and the conductive components 200.

In some embodiments, all the interconnection material layers 20a may be formed in the same manner as described above. For example, to form an interconnection material layer on the supporting and covering layer 30, the conductive components 200 and a sacrificial layer 201a are formed on the supporting and covering layer 30.

Figure 3F:
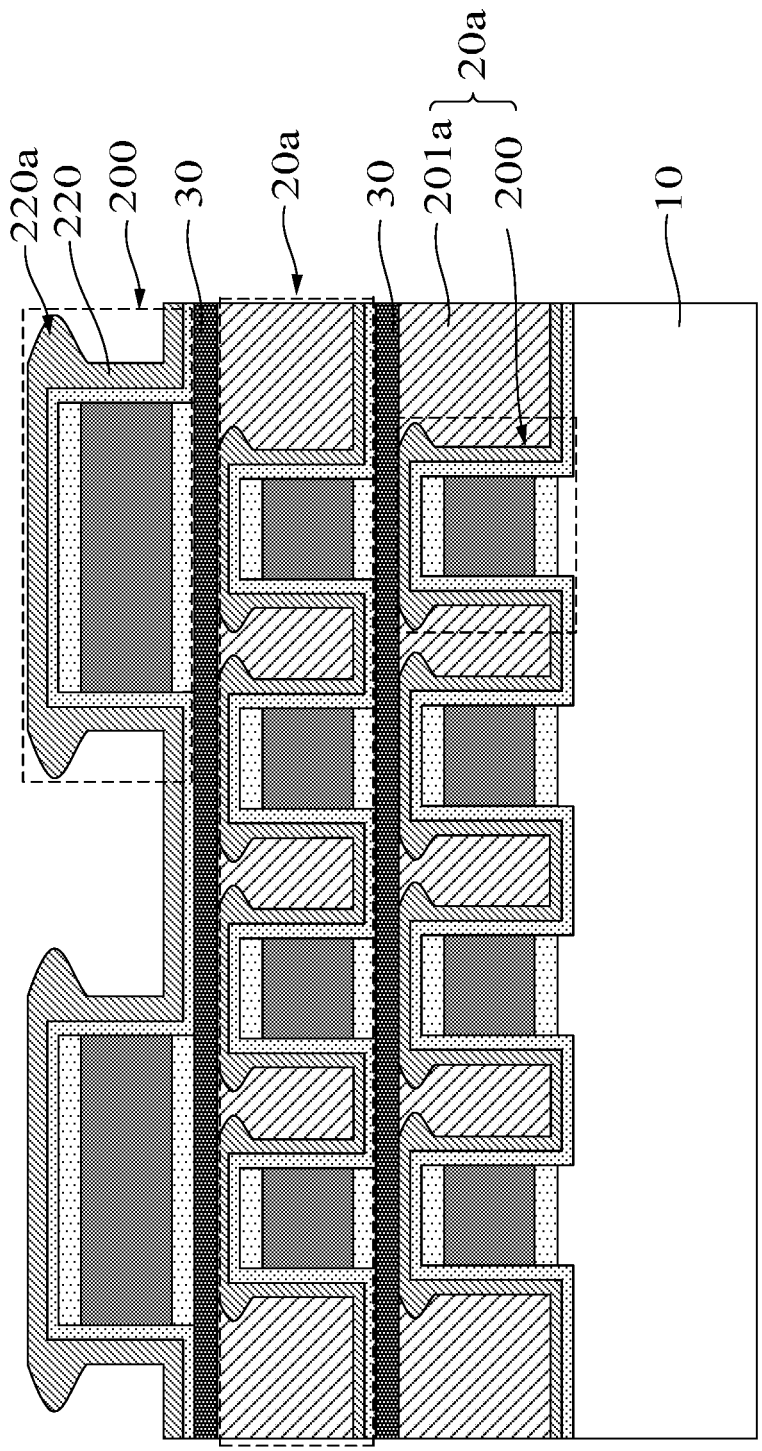

Referring to FIG. 3F, the above-described steps for forming the interconnection material layer 20a and the supporting and covering layer 30 are repeated at least once so that a plurality of interconnection material layers 20a are stacked one above another on the substrate 10. This process is described in the context of three interconnection material layers 20a, as shown in FIG. 3F.

Figure 3G:
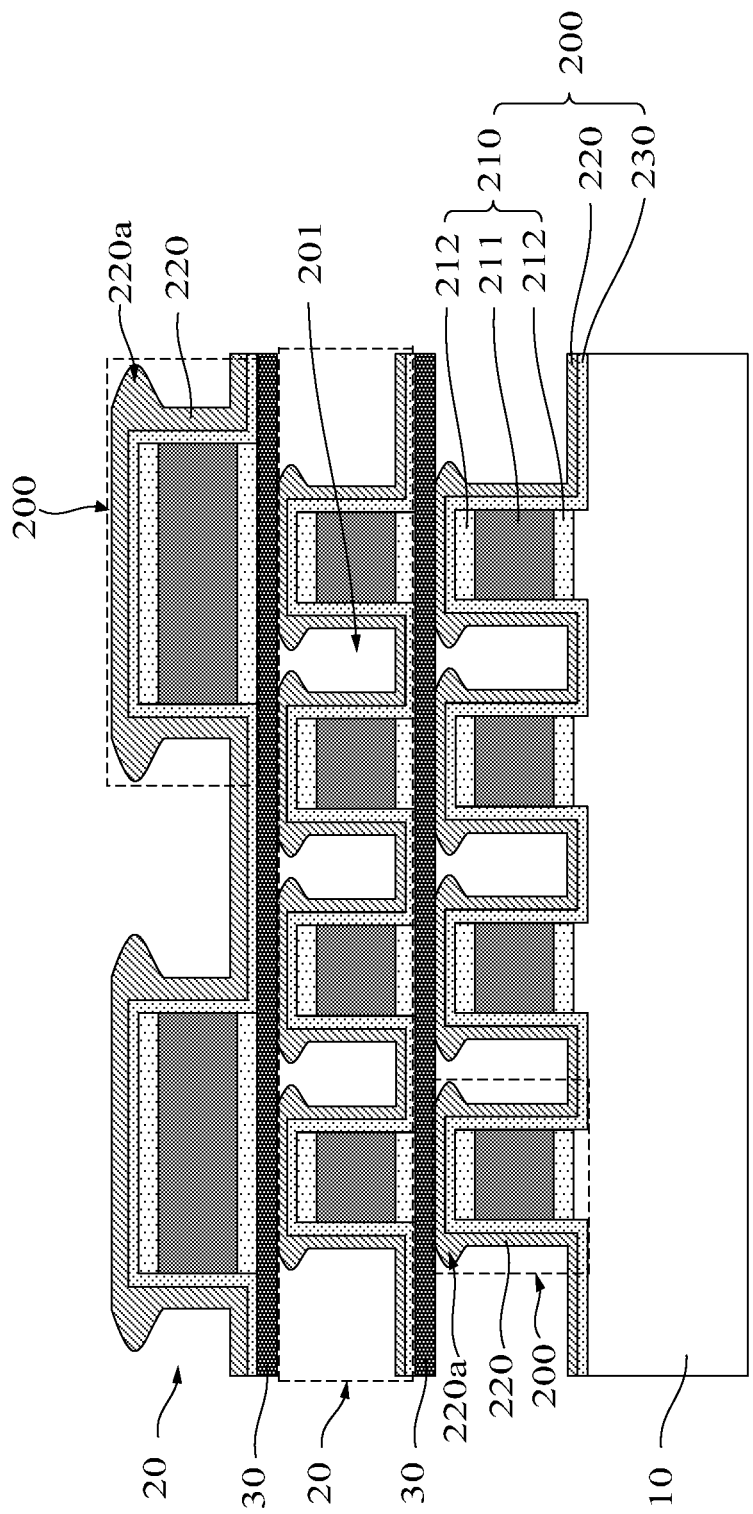

In step S130, referring to FIG. 3G, the sacrificial layers 201a are removed to form air gaps 201 between adjacent conductive components 200, wherein each of the adjacent conductive components 200 comprises a non-conductive side wall exposed to the air gap 201. The air gaps 201 are formed in the spaces previously occupied by the sacrificial layer. In each of the interconnection material layers 20a, a plurality of conductive components 200 constitute an interconnection structure layer 20. Therefore, the plurality of interconnection material layers 20a constitute a plurality of interconnection structure layers 20. The plurality of interconnection structure layers 20 and the supporting and covering layers 30 are stacked one above another on the substrate 10.

The sacrificial layers 201a may be removed by an etching process using an etchant. For example, the etchant may diffuse in the topmost interconnection material layer 20a laterally in the direction parallel to the surface of the substrate 10 to etch away the sacrificial layer 201a therein. The etchant may diffuse successively down to the lower interconnection material layers 20a underlying the supporting and covering layers 30 to laterally remove the sacrificial layers 201a therein. After the sacrificial layers 201a are removed, the non-conductive side walls of the conductive components 200 are exposed to air.

Materials from which the non-conductive side walls of the conductive components 200, the sacrificial layers 201a and the supporting and covering layers 300 are fabricated may be properly selected such that the removal of the sacrificial layers 201a is carried out at a high etching selectivity ratio between the non-conductive side walls of the conductive components 200 and the sacrificial layers 201a, as well as a high etching selectivity ratio of the supporting and covering layers 300 to the sacrificial layers 201a. In this way, the sacrificial layers 201a can be completely removed while maintaining the integrity of the conductive components 200 and the supporting and covering layers 30. In some embodiments, the non-conductive side walls of the conductive components 200 are formed by the covering films 220. Accordingly, the sacrificial layers 201a may be made of, for example, silicon oxide, while the covering films 220 and the supporting and covering layers 30 may be made of, for example, silicon nitride.

Moreover, a bonding layer 230 may be formed between the covering film 220 and the conductive structure layer 210. The bonding layer 230 provides good attachment of the covering film 220 to the conductive structure layers 210 and protects integrity of the covering film 220 from the etchant. For example, even partial covering film 220 may be peeled off during the removal of the sacrificial layers 201a by the etchant, the bonding layer 230 can still protect the underlying conductive structure layers 210 from the etchant. Further, the bonding layer 230 may be formed of a material with high resistance to the etchant (e.g., silicon oxynitride) providing even better protection to the conductive structure layers 210.

The present disclosure also provides a semiconductor device comprising the interconnection structure for metal lines as defined above. The semiconductor device may be, for example, a storage device comprising a memory cell array and peripheral circuitry. The peripheral circuitry may include the interconnection structure for leading out signals. As the interconnection structure for metal lines has reduced parasitic capacitances, the storage device has improved performance.

In sum, in the interconnection structure for metal lines of the present disclosure, adjacent conductive components are insulated from each other by air rather than by other dielectric material. Compared to the traditional interconnection structures filled with dielectric materials, the interconnection structure for metal lines of the disclosure has a significantly lower effective k-value due to the low dielectric constant of the air, and hence reduces parasitic capacitances. As a result, adverse consequences caused by parasitic capacitances, such as the RC delay problem, can be mitigated. In addition, the interconnection structure for metal lines of the present disclosure utilizes at least one supporting and covering layer to cover the underlying air gap between adjacent conductive components and to support the conductive components of the overlying interconnection structure layer. Furthermore, sacrificial material is used to fill in the spaces between adjacent conductive components, which is later removed to form the air gap insulating the adjacent conductive components. As a result, the utilization of the air gap in interconnection structure for metal lines is optimized to enhance the performance of the semiconductor device.

The present disclosure is described herein in a progressive manner. Description of embodiments focuses on differences from others. Reference can be made between the embodiments for any description common or similar between them.

The present disclosure is merely some embodiments and does not limit the scope thereof in any sense. Any and all changes and modifications made by those of ordinary skill in the art based on the above teachings fall within the scope as defined in the appended claims.

What is claimed is:

1. An interconnection structure of metal lines, comprising:
   a substrate;
   a plurality of interconnection structure layers stacked one above another on the substrate, each of the interconnection structure layers comprising a plurality of conductive components, wherein adjacent conductive components define an air gap therebetween, and each of the adjacent conductive components comprises a non-conductive side wall exposed to the air gap; and
   at least one supporting and covering layer formed between adjacent interconnection structure layers, wherein each of the at least one supporting and covering layer is attached to a top part of the conductive components of the underlying interconnection structure layer and covers the air gap defined by the adjacent conductive components of the underlying interconnection structure layer from above, and wherein each of the at least one supporting and covering layer supports the conductive components of the overlying interconnection structure layer,
   wherein each of the conductive components comprises a conductive structure layer, a covering film, and a bonding layer located between the conductive structure layer and the covering film, wherein the covering film covers a top part and side walls of the conductive structure layer and the air gap defined by the conductive components from below, the portions of the covering film over the side walls of the conductive structure layer are exposed to the air gap, and the bonding layer covers the top part and the side walls of the conductive structure layer and is covered by the covering film.

2. The interconnection structure of metal lines according to claim 1, wherein the covering film comprises a laterally extended protrusion at a peripheral area of a top part of the conductive structure layers to narrow an opening of the air gap covered by the overlying supporting and covering layer.

3. The interconnection structure of metal lines according to claim 1, wherein the bonding layer comprises a silicon oxynitride layer.

4. The interconnection structure of metal lines according to claim 1, wherein each of the conductive structure layers comprises two metal diffusion barrier structure layers and a metal structure layer sandwiched between the two metal diffusion barrier structure layers.

5. The interconnection structure of metal lines according to claim 1, wherein the air gap has a cross-sectional width that is equal to or less than a cross-sectional width of either of the adjacent conductive components defining the air gap.

6. The interconnection structure of metal lines according to claim 1, wherein in each of the interconnection structure layers, the maximum variation among heights of the conductive components' top surfaces is less than or equal to a thickness of the supporting and covering layer.

7. A method of fabricating an interconnection structure of metal lines, comprising:
   providing a substrate;
   stacking a plurality of interconnection material layers and at least one supporting and covering layer one above another on the substrate, each of the at least one supporting and covering layer disposed between adjacent interconnection material layers, wherein each of the interconnection material layers includes a plurality of conductive components and a sacrificial layer that fills gaps between the adjacent conductive components, and wherein the supporting and covering layer is attached to the conductive components and the sacrificial layer in the underlying interconnection material layer and supports the overlying interconnection material layer, wherein the plurality of conductive components comprises a plurality of conductive structure layers, a covering film, and a bonding layer located between the conductive structure layers and the covering layer, and wherein stacking the plurality of interconnection material layers and at least one supporting and covering layer one above another on the substrate comprises:
   forming the plurality of conductive structure layers on one of the supporting bases, forming the bonding layer on the supporting base, the bonding layer covering the top parts and the side walls of the conductive structure layers, forming the covering film over the supporting base, the covering film covering top parts and side walls of the plurality of conductive structure layers and covering the sacrificial layer between adjacent conductive components from below; and removing the sacrificial layer to form an air gap between the adjacent conductive components, wherein each of the adjacent conductive components comprises a non-conductive side wall exposed to the air gap, and wherein the conductive components of each of the interconnection material layers constitute an interconnection structure layer.

8. The method according to claim 7, wherein among the stacked plurality of interconnection material layers, the lowermost interconnection material layer is formed on the substrate, and the at least one supporting and covering layer and the remaining one or more interconnection material layer are stacked alternately on the lowermost interconnection material layer, and wherein each of the substrate and the at least one supporting and covering layer is used as a supporting base for supporting a corresponding one of the interconnection material layers.

9. The method according to claim 7, wherein the covering film defines a laterally extended protrusion at a peripheral area of a top part of each conductive structure layer to narrow an opening of the air gap covered by the overlying supporting and covering layer.

10. The method according to claim 7, wherein forming the bonding layer on the supporting base comprises:

forming a silicon oxide layer over the supporting base, the silicon oxide layer covering the top parts and the side walls of the plurality of conductive structure layers; and annealing the silicon oxide layer by using a nitrogen-containing gas to nitride the silicon oxide layer into a silicon oxynitride layer which constitutes the bonding layer.

11. The method according to claim 7, wherein the sacrificial layer has a top surface that is not higher than a top surface of each of the conductive components.

12. The method according to claim 7, wherein the air gap has a cross-sectional width that is equal to or less than a cross-sectional width of either of the adjacent conductive component defining the air gap.

13. The method according to claim 7, wherein in each of the interconnection material layers, the maximum variation among heights of the conductive components' top surfaces is less than or equal to a thickness of the supporting and covering layer.

14. A semiconductor device comprising an interconnection structure of metal lines, wherein the interconnection structure of metal lines comprises:

a substrate;

a plurality of interconnection structure layers stacked one above another on the substrate, each of the interconnection structure layers comprising a plurality of conductive components, wherein adjacent conductive components define an air gap therebetween, and each of the adjacent conductive components comprises a non-conductive side wall exposed to the air gap; and at least one supporting and covering layer formed between adjacent interconnection structure layers, wherein each of the at least one supporting and covering layer is attached to a top part of the conductive components of the underlying interconnection structure layer and covers the air gap defined by the adjacent conductive components of the underlying interconnection structure layer from above, and wherein each of the at least one supporting and covering layer supports the conductive components of the overlying interconnection structure layer, wherein each of the conductive components comprises a conductive structure layer, a covering film, and a bonding layer located between the conductive structure layer and the covering film, wherein the covering film covers a top part and side walls of the conductive structure layer and the air gap defined by the conductive components from below, the portions of the covering film over the side walls of the conductive structure layer are exposed to the air gap, and the bonding layer covers the top part and the side walls of the conductive structure layer and is covered by the covering film.

15. The semiconductor device of claim 14, wherein the covering film comprises a laterally extended protrusion at a peripheral area of a top part of the conductive structure layers to narrow an opening of the air gap covered by the overlying supporting and covering layer.

* * * * *